United States Patent
Koenigsmann et al.

(10) Patent No.: US 6,988,306 B2
(45) Date of Patent: Jan. 24, 2006

(54) HIGH PURITY FERROMAGNETIC SPUTTER TARGET, ASSEMBLY AND METHOD OF MANUFACTURING SAME

(75) Inventors: Holger J. Koenigsmann, Congers, NY (US); Paul S. Gilman, Suffern, NY (US); Ivan Ward, Nanuet, NY (US)

(73) Assignee: Praxair Technology, Inc., Danbury, CT (US)

( * ) Notice: Subject to any disclaimer, the term of this patent is extended or adjusted under 35 U.S.C. 154(b) by 80 days.

(21) Appl. No.: 10/724,105

(22) Filed: Dec. 1, 2003

(65) Prior Publication Data

US 2005/0115045 A1 Jun. 2, 2005

(51) Int. Cl.
*B23P 13/04* (2006.01)
(52) U.S. Cl. .......... 29/557; 29/459; 29/527.1; 204/192.12; 204/298.16; 204/298.37
(58) Field of Classification Search .......... 29/458, 29/459, 557, 527.1; 204/192.12, 298.12, 204/298.16, 298.21, 298.31, 298.37
See application file for complete search history.

(56) References Cited

U.S. PATENT DOCUMENTS

| 4,100,055 A | * | 7/1978 | Rainey | 204/298.12 |
| 4,312,731 A | * | 1/1982 | Morrison, Jr. | 204/192.12 |
| 4,401,546 A |  | 8/1983 | Nakamura et al. | 204/298 |
| 5,174,875 A | * | 12/1992 | Hurwitt et al. | 204/192.12 |
| 5,474,667 A | * | 12/1995 | Hurwitt et al. | 204/192.12 |
| 5,766,380 A |  | 6/1998 | Lo et al. | 148/577 |
| 5,827,414 A |  | 10/1998 | Westwood | 204/298.12 |
| 5,993,621 A |  | 11/1999 | Liu | 204/298.12 |
| 6,073,830 A |  | 6/2000 | Hunt et al. | 228/203 |

FOREIGN PATENT DOCUMENTS

EP 799905 10/1997

* cited by examiner

*Primary Examiner*—David P. Bryant
*Assistant Examiner*—Stephen Kenny
(74) *Attorney, Agent, or Firm*—Iurie A. Schwartz

(57) ABSTRACT

Provided is a method of forming ferromagnetic sputter targets and sputter target assemblies having a uniform distribution of magnetic leakage flux. The method includes providing a ferromagnetic sputter workpiece and hot rolling the workpiece to a substantially circular configuration sputter target; machining a taper in a surface of the sputter target to have a thickness gradient of the sputter target, where the center of the sputter target is about 0.020 to about 0.005 inches thinner than the edge of the sputter target, and where the magnetic leakage flux across the sputter target is uniformly distributed.

14 Claims, 2 Drawing Sheets

HIGH PURITY FERROMAGNETIC SPUTTER TARGET, ASSEMBLY AND METHOD OF MANUFACTURING SAME

BACKGROUND OF THE INVENTION

1. Field of the Invention

The present invention relates to sputter targets and sputter target assemblies having a uniform distribution of the magnetic leakage flux.

2. Description of Related Art

Cathode sputter targets and target assemblies are widely utilized for the deposition of thin layer materials onto wafer substrates and subsequent circuit patterns laid thereon. The process requires a gas ion bombardment of a target having a surface formed of a material that is desired to be deposited onto a substrate. The target forms part of a cathode assembly that, together with the anode, is placed in an evacuated chamber filled with an inert gas, such as argon. A high voltage electrical field is applied across the cathode and the anode. The inert gas is ionized by electrons ejected from the cathode. Positively charged gas ions are attracted to the cathode, and upon impingement with the target surface, these ions dislodge the target material. The dislodged target material traverses the evacuated chamber and deposits as a thin film on the desired substrate, which is usually located in close proximity to the anode.

To further increase sputtering the concurrent application of an arch-shaped magnetic field superimposed over the electrical field has been utilized. This method is known as a magnetron sputtering method. The arch-shaped magnetic field traps electrons in an annular region adjacent to the target surface, thereby increasing the number of electron-gas atom collisions in the area to produce an increase in the number of positive gas ions (i.e., plasma) in the region that strike the target to dislodge the target material.

For magnetron sputter targets, the magnetic leakage flux (MLF), also known as magnetic pass through flux (PTF) at the target surface must be high enough to ignite and sustain the plasma. Under normal sputtering conditions, the higher the magnet strength, the higher the MLF. In the case of ferromagnetic materials, however, the strength of the high intrinsic permeability of the material effectively shields or shunts the magnetic field from the magnets behind the target and hence reduces the MLF on the target surface.

Considering the importance of the magnetic properties of sputter targets, manufacturers have relied upon various techniques to fabricate sputter targets with lower sputter target permeability and an increased PTF.

U.S. Pat. No. 4,401,546 discloses a planar ferromagnetic segmented target, where the segments are separated by gaps through which the magnetic field leaks to produce an MLF of 200 Gauss on the surface of the target.

U.S. Pat. No. 5,827,414 discloses a planar ferromagnetic target having a certain thickness due to the gaps in the target. The gaps in this configuration are radial gaps formed by slots in the target body that are perpendicular to the flux of the magnetron, thereby producing a more effective and homogeneous leakage magnetic field on and parallel to the surface of the target body so that the sputtering plasma density may be increased.

Other techniques developed include the hot or cold working of the sputter target blank to increase the PTF by manipulating the crystallographic structure. European Patent Document No. 799905 recognized that strain can manipulate a high-purity cobalt target's permeability. This patent publication discloses a process that relies upon either cold or warm rolling to reduce the target's initial permeability parallel to the target's surface to about 7. However, this process increases the permeability perpendicular to the target's surface.

U.S. Pat. No. 5,766,380 discloses a cryogenic method for fabricating aluminum alloy sputter targets. This method uses cryogenic processing with a final annealing step to recrystallize the grains into a desired texture. Similarly, U.S. Pat. No. 5,993,621 utilizes cryogenic working and annealing to manipulate and enhance crystallographic texture of titanium sputter targets.

Unfortunately, these processes have limited success with respect to the limited target thickness and control of the target's final magnetic properties, which in turn negatively affects the deposition rates and the film uniformity.

To meet the requirements of the semiconductor manufacturing industry and to overcome the disadvantages of the related art, it is an object of the present invention to provide a ferromagnetic sputter target and assembly with a uniform MLF.

It is also an object of the invention to provide a method of forming said ferromagnetic sputter target and assembly.

It is another object of the invention to provide an increased target thickness uniformity.

As a result of the invention, the target life is increased, and the cost of manufacturing the wafers is decreased. In addition, the film deposited onto the substrate has an increased uniformity.

Other objects and advantages of the present invention will become apparent to one of ordinary skill in the art upon review of the specification, drawings and claims appended hereto.

SUMMARY OF THE INVENTION

The foregoing objectives are met by the methods and sputter target assembly of the present invention. According to one aspect of the invention, a method of forming a ferromagnetic sputter target is provided. The method includes providing a ferromagnetic sputter workpiece and hot rolling the workpiece to a substantially circular configuration sputter target; machining a taper in a surface of the sputter target to have a thickness gradient of the sputter target, where the center of the sputter target is about 0.020 to about 0.005 inches thinner than the edge of said sputter target, and where the magnetic leakage flux across the sputter target is uniformly distributed.

According to a second aspect of the invention, a method of forming a sputter target assembly is provided. The method includes providing a ferromagnetic sputter target with a taper in a surface thereof, where the thickness gradient of the taper is such that the thickness at the center of the sputter target is about 0.020 to about 0.005 inches thinner than at the edge of the sputter target and where the magnetic leakage flux across the sputter target is uniformly distributed; applying a bond metal layer between the sputter target and a backing plate; pressing the sputter target and the backing plate; and forming a solid state bond therebetween to obtain the sputter target assembly.

According to another aspect of the invention, a ferromagnetic sputter target is provided. The target is a substantially circular target having a taper in a surface thereof and a target thickness gradient, where the thickness gradient at the center of the sputter target is about 0.020 to about 0.005 inches thinner than the edge of the sputter target, and wherein the magnetic leakage flux across the sputter target is uniformly distributed.

According to yet another aspect of the invention, a sputter target assembly is provided. The assembly includes a ferromagnetic sputter target with a taper in a surface thereof, where the thickness gradient of the taper is such that the thickness at the center of the sputter target is about 0.020 to about 0.005 inches thinner than at the edge of the sputter target and where the magnetic leakage flux across the sputter target is uniformly distributed; a backing plate with a matching recess therein having the ferromagnetic sputter target disposed therein and solid state bonded thereto to obtain the sputter target assembly.

BRIEF DESCRIPTION OF THE DRAWINGS

The objects and advantages of the invention will become apparent from the following detailed description of the preferred embodiments thereof in connection with the accompanying drawings wherein like numbers denote like feature and in which.

DETAILED DESCRIPTION OF THE INVENTION

The present invention provides a planar single-piece ferromagnetic sputter target and assembly. In ferromagnetic sputter targets and assemblies the magnetic properties of the material are absolutely critical for the performance of the target in producing uniformly sputtered films on 300 mm wafers. The magnetic properties of the target may be controlled through the thermomechanical treatment of the blank metal workpiece, where uniformity is imposed by the microstructural evolution attained through either hot-working, cold-working, forging, or cryogenic treatment of the blank workpiece.

Modifying the target configuration, however, significantly affects the uniformity achieved. It has been shown that conventional sputter targets have a magnetic leakage flux which is higher at the edges than at the center of the target as the magnetic leakage flux flows around the edges of the target, while the ferromagnetic material at the center of the target shunts the flux.

In accordance with the principles of the present invention, a ferromagnetic material is formed into a solid, unitary sputter target configuration, such as a plate having an even permeability throughout the material. The sputter target has a thickness gradient, where the thicker target edge counteracts the edge effect of the flux. Ferromagnetic materials contemplated by the invention include, by way of example, pure nickel (Ni) and Ni-based alloys, such as NiFe and NiFeCo; pure iron (Fe) and Fe-based alloys, such as FeTa, FeCo and FeNi; pure cobalt (Co) and Co-based alloys, such as CoCr, CoCrPt; and other binary, ternary and higher degree of elemental alloys comprising Ni, Fe, Co and other elements having an intrinsic magnetic permeability greater than 1.0.

Figure 1:
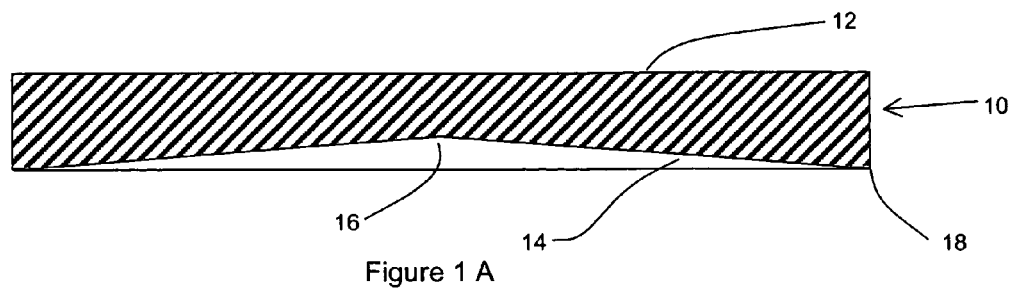
FIG. 1A illustrates a cross-sectional view of target in accordance with one of the embodiments of the invention.
FIG. 1B illustrates a perspective view of the bottom surface of the target.
FIG. 1C illustrates a cross-sectional view of the target having a parabolic bottom surface configuration.
FIG. 1D illustrates a cross-sectional view of the target having a linear bottom surface configuration.
Figure 1:
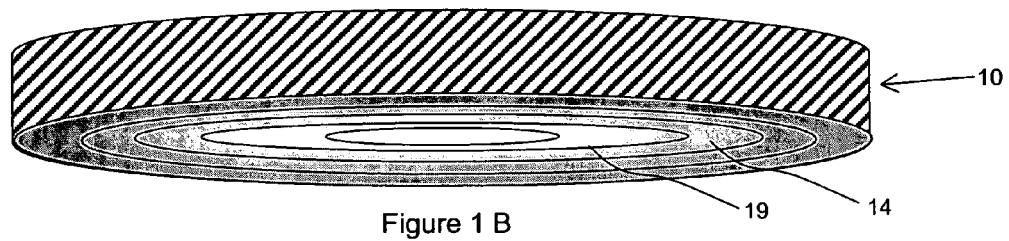
Figure 1:
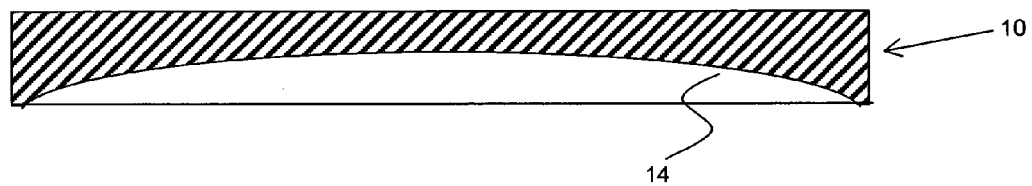
Figure 1:
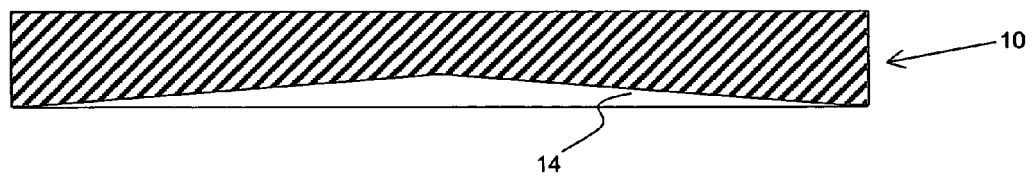

With reference to FIG. 1A, sputter target 10 is a substantially circular disc-shaped, high-purity ferromagnetic nickel or cobalt target. The ferromagnetic sputter target has a purity of at least about 99.99 weight percent. For purposes of this specification, all concentrations are in weight percent. Advantageously, sputter targets have a purity of at least 99.995 weight percent and more advantageously at least about 99.999 weight percent. While sputter target 10, as depicted, is disc-shaped, it will be understood by those skilled in the art that other shape targets, such as oval, square, or rectangular may be utilized.

As aforementioned, target 10 can be manufactured from a blank workpiece, which is forged and hot worked or cold worked or cryogenically formed. Hot working reduces the residual stresses in the workpiece, but typically results in a higher magnetic permeability than cold working or cryogenic forming. The sputtering surface 12 is typically maintained planar to dislodge the material therefrom continuously and to place a uniform layer onto the substrate. Surface 14 of sputter target 10 is machined, forged, pressed, or cast to form a slight taper (exaggerated in the figure) extending radially from the center 16 to edge 18 of sputter target 10. The taper causes a slight thickness gradient from the center 16 to the edge 18, wherein the sputter target 10 is about 0.020 to about 0.003 inches thinner at the center 16, and preferably about 0.020 to about 0.005 inches thinner at the center 16, and most preferably about 0.010 to about 0.005 inches thinner at the center 16.

Figure 2:
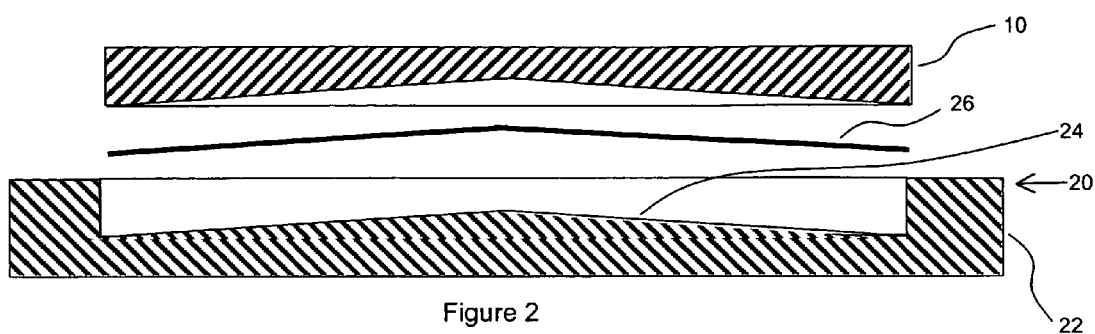
FIG. 2 illustrates a cross-sectional view of the target and backing plate which form the target assembly.

The taper may be configured in any number of ways that would provide the thickness gradient. As shown in FIG. 1B, surface 14 has a number of concentric circles 19, wherein the thickness decreases from the outermost to the innermost concentric circle. However, the thickness within each concentric circle is uniform. Among the exemplary configurations contemplated in the present invention, as illustrated in FIG. 1C, the taper can be parabolic extending from the edge to the center of the sputter target. Alternatively, as shown in FIG. 1D, the taper can be linear extending from the edge to the center of the target. As aforementioned, sputtering surface 12 is typically maintained planar. However, this sputtering surface may be modified in similar manner as discussed with reference to surface 14, to contain a taper which is parabolic or linear (not shown). In this case, the taper should not exceed 0.010 inches. With reference to FIG. 2, a target/backing plate assembly is illustrated. Target/backing assemblies provide the backing plate which secures the target in the sputtering apparatus and further reduce costs associated with the targets. Sputter target assembly 20 provides a backing plate 22 with a recess 24 machined therein which mates with the taper of target 10 inlaid therein. The overall height of sputter target assembly 20 maintains the industry accepted height dimension as shown in U.S. Pat. No. 6,073,830 which is incorporated by reference in its entirety. The metals utilized for the backing plate may be any number of metals and include aluminum (Al), titanium (Ti), copper (Cu), and alloys thereof. Preferably, the backing plate is made of a copper alloy.

The sputter target 10 is inserted into backing plate 22 and secured thereto via a strong bond. A number of bonding techniques have been developed and utilized to secure sputter targets to the backing plates. Acceptable bonding techniques include soldering, brazing, diffusion bonding, explosion bonding, mechanical fastening and epoxy bonding. However, depending on the materials chosen for the target and the backing plate, the bonding technique has to be carefully selected to avoid deleterious changes in the microstructure (e.g., grain growth) of the sputter target and to account for the difference in the coefficients of thermal expansion of the target and the backing plate. A mismatch in the coefficients of thermal expansion may simply result in deflection of the target or delamination of the two components, which would result in an unsatisfactory deposition onto the substrate and possible failure of the target assembly during use, respectively.

The most suitable bonding method depends on the target and backing plate materials. For example, high-purity nickel and nickel based targets often require bonding to copper backing plates at temperatures low enough to retain a fine microstructure and low magnetic permeability. For these types of materials a solid state bond is most advantageous, because this type of bonding uses low temperature processing and prevents changes of the microstructure or magnetic properties within the nickel-based target. Solid state bonding is disclosed in pending U.S. Ser. No. 10/153,660 which is hereby incorporated by reference in its entirety.

A bond metal layer 26 may be applied between sputter target 10 and backing plate 22 to form the solid state bond. Acceptable bond metals include the following precious metals: gold, silver, platinum, palladium, iridium, rhodium, ruthenium and osmium. For cost considerations, silver represents the most advantageous metal for forming solid state bonds. Acceptable techniques for coating with the bond metal layer include both foil utilization and electrodeposition processes. The electrodeposited bond layer has a thickness of at least 15 $\mu$m. Preferably, the solid state bond layer has total thickness of about 40 to about 100 $\mu$m.

Pressing sputter target 10 into backing plate 22 with bond metal layer 26 therebetween forms a solid state bond. The pressing occurs in a direction perpendicular to the sputter target's surface or face. Both hot uniaxial pressing and hot isostatic pressing are advantageous methods for forming solid state bonds between the target assembly components. Heating the bond metal to a temperature below the sputter target's grain growth temperature improves the solid state bond's integrity.

If the sputter target is nickel based and the backing plate is copper based, then the pressing advantageously occurs at pressures above about 70 MPa and at a temperature of about 260 to 320° C. Generally, increasing pressing temperature improves the bond's strength, but increases the likelihood of detrimental grain growth within the sputter target. Most preferably, the pressing occurs at a temperature between about 300 and about 320° C. and pressing occurs at a pressure of about 100 MPa. Under these conditions the microstructure of the target is unchanged and the taper is maintained.

Figure 3:
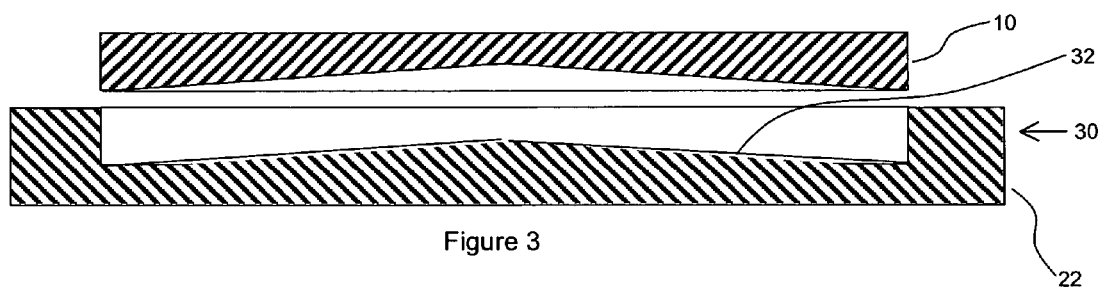
FIG. 3 illustrates a cross-sectional view of the target and backing plate, wherein the mating surface of the target has been treated.

As illustrated in FIG. 3, the preparation of the bonding may consist of roughening the matching recessed surface 32 of backing plate 22 in assembly 30. The bond interface may not lend itself to surface roughening of sputter target 10, since it may change the overall dimensions of the sputter target thickness gradient. However, to improve the bond, a surface treatment step forms an uneven surface topology wherein the bond metal layer anchors. As a result, a lower bonding pressure and temperature can be utilized to form assembly 30. Acceptable surface roughening techniques include, but are not limited to, particle blasting, shot peening and etching. Particles used in particle blasting can be selected from a group that may include, but is not limited to: grit, sand, glass beads and steel shot. This process causes subtle disruptions of the associated bonding surfaces when the components are heated and pressed. Most preferably, the process uses grit blasting to roughen the backing plate recess to promote the formation of desirable solid state bonding.

As shown in Table 1, the present invention decreased both the magnetic leakage flux (MLF) range and the MLF standard deviation of nickel targets by more than 30 percent compared to the related art, which contains planar surfaces 12 and 14. For each of the four targets in Table 1, the MLF was measured in 25 points located in the target center and three concentric circles. All four targets had a nickel diameter of 17.2 inches and a nickel thickness of 0.1 inches. They were bonded to copper-chromium (C18200) backing plates having a thickness of 0.9 inches.

TABLE 1

|  | Related Art | | Present Invention | |
| --- | --- | --- | --- | --- |
| Property | Target 1 | Target 2 | Target 3 | Target 4 |
| MLF Range | 80 | 79 | 55 | 53 |
| MLF Deviation | 26 | 23 | 18 | 16 |

While the invention has been described in detail with reference to specific embodiments thereof, it will be apparent to those skilled in the art that various changes and modifications can be made, and equivalents employed, without departing from the scope of the appended claims.

We claim:

1. A method of forming a ferromagnetic sputter target comprising the steps of:
   providing a ferromagnetic sputter workpiece and hot rolling the workpiece to a substantially circular configuration sputter target;
   machining a taper in a surface of the sputter target to have a thickness gradient of the sputter target, where the center of the sputter target is about 0.020 to about 0.005 inches thinner than the edge of said sputter target, and where the magnetic leakage flux across the sputter target is uniformly distributed.

2. The method of claim 1, wherein the thickness gradient in the sputter target is linear or parabolic.

3. The method of claim 1, further comprising machining the taper in a concentric configuration on the surface of the sputter target, where the thickness decreases from the outermost concentric circle to the innermost concentric circle.

4. The method of claim 3, wherein the thickness of the spotter target within each concentric circle is uniform.

5. The method of claim 1, wherein the sputter target is nickel.

6. The method of claim 1, further comprising cold rolling, forging or cryogenic forming of the ferromagnetic sputter workpiece.

7. The method of claim 1, wherein the thickness in the center of the sputter target is about 0.010 to about 0.005 inches thinner than the edge of said sputter target.

8. The method of claim 1 further comprising the steps of:
   applying a bond metal layer between the sputter target and a backing plate;
   pressing the sputter target and the backing plate; and
   forming a solid state bond therebetween to obtain a sputter target assembly.

9. The method of claim 8, wherein the ferromagnetic sputter target is nickel and the backing plate is a copper alloy.

10. The method of claim 8, wherein the pressing of the sputter target and the backing plate occurs at a pressure above about 70 MPa and at a temperature of about 260 to 320° C.

11. The method of claim 8, wherein the thickness gradient of the taper in said sputter target is linear or parabolic.

12. The method of claim 8, further comprising machining the taper in a concentric configuration on the surface of the sputter target, where the thickness decreases from the outermost concentric circle to the innermost concentric circle.

13. The method of claim 12, wherein the thickness of the sputter target within each concentric circle is uniform.

14. The method of claim 1, wherein:
   the ferromagnetic sputter target has a first and second surface, wherein the first surface is a flat sputtering surface and the second surface is tapered to a thickness gradient such that the thickness at the center of the sputter target is about 0.020 to about 0.005 inches thinner than at the edge of the sputter target where the magnetic leakage flux across the sputter target is uniformly distributed;
   providing a backing plate with a matching recess to the second surface of the sputter target;
   applying a bond metal layer between the second surface of the sputter target and the backing plate;
   pressing the sputter target and the backing plate; and
   forming a solid state bond therebetween to obtain the sputter target assembly.

* * * * *

UNITED STATES PATENT AND TRADEMARK OFFICE
CERTIFICATE OF CORRECTION

PATENT NO. : 6,988,306 B2
DATED : January 24, 2006
INVENTOR(S) : Koenigsmann et al.

It is certified that error appears in the above-identified patent and that said Letters Patent is hereby corrected as shown below:

<u>Title page,</u>
Item [75], Inventors, add -- Thomas J. Hunt --.

<u>Column 6,</u>
Line 49, replace "The method of claim 3, wherein the thickness of spotter target within each concentric circle is uniform" with -- The method of claim 3, wherein the thickness of sputter target within each concentric circle is uniform. --.

Signed and Sealed this

Eleventh Day of April, 2006

JON W. DUDAS
*Director of the United States Patent and Trademark Office*